(12) United States Patent  (10) Patent No.: US 7,659,618 B2
Dangelmaier et al.  (45) Date of Patent: Feb. 9, 2010

(54) SEMICONDUCTOR DEVICE FOR RADIO FREQUENCIES OF MORE THAN 10 GHZ AND METHOD FOR PRODUCING THE DEVICE

(75) Inventors: Jochen Dangelmaier, Beratzhausen (DE); Klaus Pressel, Regensburg (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 478 days.

(21) Appl. No.: 11/488,872

(22) Filed: Jul. 18, 2006

(65) Prior Publication Data

US 2007/0023896 A1  Feb. 1, 2007

(30) Foreign Application Priority Data

Jul. 18, 2005  (DE) .................. 10 2005 034 011

(51) Int. Cl.
 *H01L 23/34* (2006.01)
(52) U.S. Cl. ................ 257/728; 257/777; 257/686; 257/787; 257/790; 257/E21.581
(58) Field of Classification Search .......... 257/790, 257/728, E21.581
See application file for complete search history.

(56) References Cited

U.S. PATENT DOCUMENTS 6,331,221 B1 * 12/2001 Cobbley .................. 156/60

| 6,446,316 | B1 | 9/2002 | Fürbacher et al. |
| 7,180,169 | B2 * | 2/2007 | Ishimaru et al. ............. 257/690 |
| 2002/0020923 | A1 * | 2/2002 | Kanatake ..................... 257/778 |
| 2002/0093548 | A1 | 7/2002 | Jarrold et al. |
| 2003/0157747 | A1 | 8/2003 | Chen et al. |
| 2005/0046044 | A1 | 3/2005 | Theuss |

FOREIGN PATENT DOCUMENTS

| DE | 10205127 A1 | 8/2003 |
| DE | 10310617 A1 | 9/2004 |
| DE | 10310615 B3 | 11/2004 |
| EP | 1311072 A1 | 5/2003 |
| JP | 2000209006 | 7/2000 |
| KR | 2002055801 A | 7/2002 |

* cited by examiner

*Primary Examiner*—Thao X Le
*Assistant Examiner*—Ajay K Arora
(74) *Attorney, Agent, or Firm*—Dicke, Billig, & Czaja, P.L.L.C.

(57) ABSTRACT

A semiconductor device for radio frequencies of more than 10 GHz having a semiconductor chip is disclosed. In one embodiment, the semiconductor chip, on its active top side, having a radio-frequency region and a low-frequency region and/or a region which is supplied with DC voltage. In one embodiment, the low-frequency region and/or the region which is supplied with DC voltage of the semiconductor chip is directly embedded in a plastic housing composition, the plastic housing composition is arranged such that it is spaced apart from the radio-frequency region on the active top side of the semiconductor chip.

17 Claims, 3 Drawing Sheets

SEMICONDUCTOR DEVICE FOR RADIO FREQUENCIES OF MORE THAN 10 GHZ AND METHOD FOR PRODUCING THE DEVICE

CROSS-REFERENCE TO RELATED APPLICATIONS

This Utility Patent Application claims priority to German Patent Application No. DE 10 2005 034011.3 filed on Jul. 18, 2005, which is incorporated herein by reference.

BACKGROUND

The invention relates to a semiconductor device for radio frequencies of more than 10 GHz and to a method for producing the device.

In one embodiment, the semiconductor device has a semiconductor chip which, on its active top side, has a radio-frequency region and a low-frequency region and/or a region which is supplied with DC voltage. In this case, the low-frequency region and/or the region which is supplied with DC voltage of the semiconductor chip may be embedded without problems in a plastic housing composition having a relative permittivity of 3 to 5. In the case of electronic components to which radio frequencies are applied, such materials of a plastic housing composition in the direct surroundings of the conductor tracks influence the electrical properties of the radio-frequency device and considerably restrict the processability and integrity of radio-frequency signals.

In this case, the dielectric constant $\epsilon$, where $\epsilon = \epsilon_r \cdot \epsilon_0$, $\epsilon_0$ being the absolute permittivity in free space and $\epsilon_r$ being the relative permittivity, influences the signal propagation speed which is proportional to $\epsilon^{-1/2}$. Therefore, low values of the relative permittivity $\epsilon_r$ are strived for for radio-frequency semiconductor components in order to achieve fast propagation speeds and thus short delay times. In addition, the dielectric constant influences the impedances of the conductor tracks since the impedances increase approximately in proportion to $\epsilon$. Another physical factor which is dependent on the surrounding material is the loss factor tan$\delta$. The loss factor tan$\delta$ determines the dispersion or distortion of a signal. A high loss factor causes the signal to disperse, with the result that a square-wave pulse does not retain its shape. Therefore, there is also the need for a low loss factor for radio-frequency devices in this case since, for example, the square-wave pulses then retain their shape in virtually undistorted fashion during the propagation time over a prescribed distance.

The current plastic housing compositions including filled plastics such as duroplasts or thermoplasts have a typical value of the dielectric constant or the relative permittivity $\epsilon_r$ of approximately 3 to 5 and a loss factor tan$\delta$ of approximately 0.01. In this case, these values depend both on the temperature and on the frequency, the above values relating to radio frequencies of approximately 1 GHz and the interaction with the surrounding material and the effect on the electrical properties becoming ever more critical as the frequency increases. On the other hand, it is not possible to dispense with a plastic material for protecting the surface of the radio-frequency semiconductor chips and the integrated circuits on these semiconductor chips in order to ensure the reliability and lifetime of such semiconductor devices. The abovementioned material properties as regards the dielectric constant $\epsilon_r$ and the loss factor tan$\delta$ limit the applicability of conventional housing technologies to certain radio-frequency applications, the radio-frequency properties of the semiconductor components being greatly restricted and deteriorating as of a certain cut-off frequency.

These cut-off frequencies have hitherto been a few GHz, with the result that there is a need to push out these cut-off frequencies further into the range of several 10 GHz to a few 100 GHz. In order to push out these limits, use is preferably made of cavity housings in which the internal electrical connecting elements such as wire connections are now no longer encapsulated by plastic with the disadvantage that such exposed wire connections greatly reduce the reliability of the semiconductor components. Other solution approaches operate using flip-chip contacts in order to avoid the wires drifting and to shorten the length of the connecting elements. However, even these run into cut-off frequencies, depending on the size of the flip-chip contacts, if the signals are radio-frequency signals of more than 10 GHz.

The document U.S. Pat. No. 6,446,316 B1 discloses the encapsulation of SAW components, "surface acoustic wave" filters. In this case, during encapsulation, a cap is placed onto the semiconductor substrate in order to protect the radio-frequency components from contact with the plastic housing composition. The cap has the form of a cover and has cutouts in which the radio-frequency components of the SAW filter are arranged. In order to produce such a cover which has been patterned with cutouts, a layer which can be patterned by means of photolithography is applied to the cover and is then patterned by means of exposure and development and applied to the substrate including semiconductor material. A cover which has been patterned with cutouts in this manner requires a manufacturing method which is associated with high costs especially since the alignment of the cover on the substrate also gives rise to problems.

For these and other reasons, there is a need for the present invention.

SUMMARY

The invention provides a semiconductor device for radio frequencies of more than 10 GHz having a semiconductor chip, the semiconductor chip, on its active top side, having a radio-frequency region and a low-frequency region and/or a region which is supplied with DC voltage. The low-frequency region and/or the region which is supplied with DC voltage of the semiconductor chip is directly embedded in a plastic housing composition. The plastic housing composition is arranged such that it is spaced apart from the radio-frequency region on the active top side of the semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
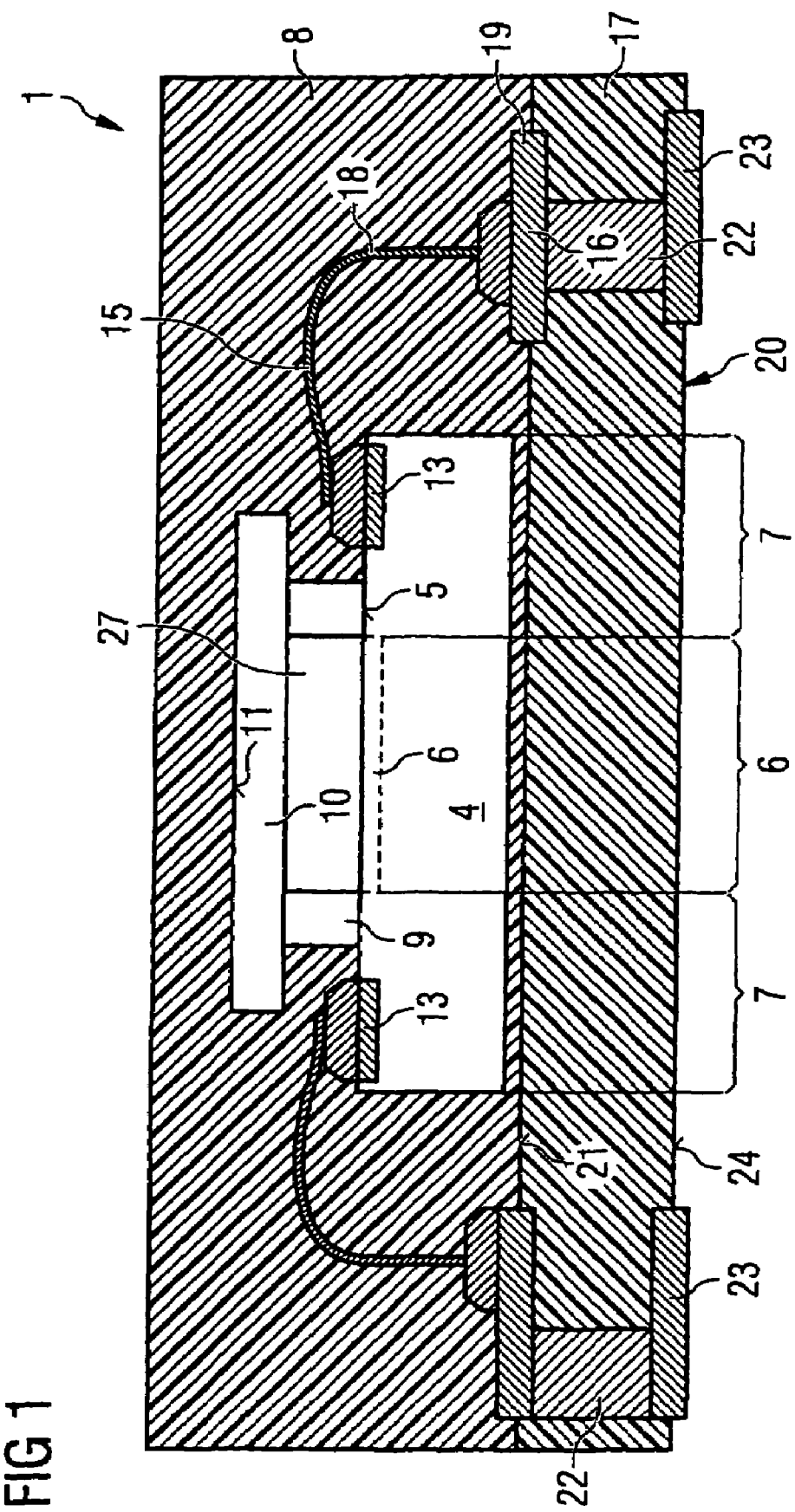
FIG. 1 illustrates a diagrammatic cross section of a semiconductor device according to a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device for radio frequencies of more than 10 GHz which can be produced cost-effectively using simple means and considerably increases the cut-off frequencies of conventional radio-frequency semiconductor devices in a plastic housing composition in a reliable manner.

In one embodiment, the invention provides a semiconductor device for radio frequencies of more than 10 GHz having a semiconductor chip which, on its active top side, includes a radio-frequency region and a low-frequency region and/or a region which is supplied with DC voltage. In this case, the low-frequency region and/or the region which is supplied with DC voltage of the semiconductor chip is/are embedded in a plastic housing composition. The plastic housing composition is arranged such that it is spaced apart from the radio-frequency region, by means of a cavity, on the active top side of the semiconductor chip.

In this semiconductor device, regions which are sensitive to radio frequencies are not touched by the plastic housing composition but rather there is a space between the plastic housing composition and the regions which are sensitive to radio frequencies. The relative permittivity $\epsilon$ is approximately 1 in the immediate surroundings of the conductor tracks and structures which conduct radio frequencies and thus assumes the lowest naturally occurring value.

In one embodiment of the invention, the radio-frequency region has at least one contact area having a bonding wire, the bonding wire being partially arranged in the cavity and being partially arranged in the plastic housing composition. To this end, the bonding wire is fixed in an adhesive layer between a cover and a wall structure of the cavity. The adhesive layer has a thickness which is greater than or equal to the diameter of the bonding wire.

This ensures that, after the bonding wire has been fixed in the adhesive layer between the cover and the wall structure, the bonding wire cannot drift when being applied and embedded in a plastic housing composition, and part of the bonding wire is thus reliably embedded in the plastic housing.

This provides for contact pads which are subjected to radio frequencies are not directly embedded in the plastic housing composition but rather the contact areas are free of plastic housing composition in regions which are sensitive to radio frequencies. A plastic housing composition is provided only when the bonding wire is routed through the adhesive layer between the cover and the wall structure to the outside to a corresponding contact pad on the wiring substrate, thus advantageously fixing the position of the bonding wire.

In another embodiment of the invention, the wall structure provides that the plastic housing composition which is arranged such that it is spaced apart from the active top side of the semiconductor chip in regions which are sensitive to radio frequencies and the plastic housing composition which rests directly on the active top side of the semiconductor chip in the low-frequency regions or the regions which are supplied with DC voltage are precisely delimited. This wall structure may have a material which has been patterned by photolithography and has been cured. The wall structure can be applied to semiconductor wafers for a multiplicity of semiconductor chips as early as when producing the semiconductor chips on the basis of the semiconductor wafers and can achieve a height of several tenths of a micrometer to a few millimeters. The height of the wall structure simultaneously also defines the distance between the plastic housing composition and the active top side of the semiconductor chip.

Provision is also made for the wall structure to be terminated by a cover whose areal extent has been adapted. Such a cover ensures that, when applying a plastic housing composition, the radio-frequency region remains protected, so that no plastic housing composition directly touches the radio-frequency region. Adapting the cover to the areal extent of the wall structure simultaneously makes it possible to ensure that correspondingly good sealing with respect to the wall structure is achieved.

In another embodiment of the semiconductor device for radio frequencies of more than 10 GHz, the wall structure and also parts of the cover are surrounded by the plastic housing composition. The plastic composition and the cover are kept in position such that they are sealed with respect to one another.

In another embodiment of the invention, the top side of the cover is free of plastic housing composition. In one embodiment, the cover includes a metallic material, so that the free top side of the cover can be used to fit additional cooling elements or heat sinks. Provision is furthermore made for the cover to compriseе a silicon plate. The basic substance of the semiconductor chips is usually silicon and the coefficient of thermal expansion of the silicon plate is thus matched to the coefficient of thermal expansion of the semiconductor chip.

In another design of the cover, the latter is produced from a metal plate. Additional cooling elements and/or heat sinks may be fitted or soldered to the top side of the cover. Furthermore, it is also possible for the cover to include a glass plate and/or a ceramic plate. These glass plates or ceramic plates are, on the one hand, arranged such that they are spaced apart from the radio-frequency region on the active top side of the semiconductor chip and, on the other hand, have the additional advantage that their relative permittivity $\epsilon_r$ is smaller than the abovementioned range of between 3 and 5 and that the tan$\delta$ can also be reduced further by these materials.

Finally, it is possible for the cover to include a polymeric plastic plate. Such a polymeric plastic plate may be produced, for example, from a glass-fiber-reinforced resin, this having the advantage that such a plastic plate can be embedded without any great problems in the surrounding plastic housing composition, especially since the coefficient of thermal expansion can be brought into line perfectly well with the plastic housing composition, and has greater affinity to the surrounding plastic housing composition than is the case with other materials.

In order to reliably fix and seal the cover on the wall structure, provision is made for a double-sided adhesive film to be arranged between the cover and the wall. This double-sided adhesive film ensures that, on the one hand, the wall structure is adhesively connected to the film and, on the other hand, the cover structure adhesively rests on the second adhesive layer of the film.

In another embodiment of the invention, an adhesive layer is arranged between the cover and the wall. This has the advantage that the thickness of the adhesive layer can be varied with respect to a double-sided adhesive film in order to match it to particular components of the radio-frequency semiconductor device.

In another embodiment of the invention, the active top side of the semiconductor chip has contact areas outside the wall structure. These contact areas are electrically connected to contact pads on a wiring substrate via bonding wires. In this case, the bonding wires are completely embedded in the plastic housing composition, with the result that they do not run freely in space and there is thus no risk of a short circuit. In this case, only those contact areas and bonding wires which have to transport low-frequency signals and/or are intended to be supplied with direct current are embedded in a plastic housing composition.

In another embodiment of the invention, the active top side of the semiconductor chip has contact areas outside and inside the wall structure. In this case, these contact areas, both inside and outside the wall structure, are electrically connected to contact pads on a wiring substrate via bonding wires. The special feature is now that the bonding wires for the contact areas inside the wall structure are introduced, as mentioned above, into an adhesive layer between the cover and the wall structure, the adhesive layer having a thickness which is greater than or equal to the diameter of the bonding wires.

In order to keep a prescribed distance between the plastic housing composition and the active top side of the semiconductor chip in the radio-frequency region, the height of the wall structure may be set to be between several hundred nanometers and a few millimeters depending on the height of the applied wall structure. These radio-frequency components having radio frequencies of more than 10 GHz are intended, in particular, for distance radar sensor technology for road and/or rail vehicles and for aircraft in the taxiing and parked traffic on airfields, which operates at an operating frequency of 24 GHz or in the range of from 77 to 80 GHz.

A method for producing a semiconductor device for radio frequencies of more than 10 GHz has the following process. A semiconductor wafer having a multiplicity of semiconductor chips which are arranged in rows and columns and have, on their active top sides, radio-frequency regions and low-frequency regions and/or regions which are supplied with DC voltage is produced. A wall structure which surrounds the radio-frequency regions is then applied to the semiconductor wafer. The semiconductor wafer is then separated into a multiplicity of semiconductor chips. The individual semiconductor chips are applied with their wall structure to a carrier having a plurality of semiconductor device positions. The semiconductor chip is then connected to a wiring structure of the carrier via connecting elements.

An adapted cover is applied to the wall structure and the semiconductor chips, the connecting elements, the wall structure and at least parts of the cover and parts of the carrier are then packaged in a plastic housing composition. The carrier is then separated into individual semiconductor devices.

The wall structure which surrounds the radio-frequency regions on the active top sides of the semiconductor chips is introduced, as early as at the wafer level, for a multiplicity of semiconductor chip positions, which are arranged in rows and columns, using a single process. In one embodiment of the invention, a wall structure which surrounds the radio-frequency regions can be applied using photolithography. In this case, the wall structure is formed from a photoresist which has been patterned by means of photolithography and has been cured. The height of the wall structure then depends on the thickness of the applied photoresist layer and simultaneously determines the distance between the plastic housing composition, which is still to be applied, and the active top side of the semiconductor chip in the radio-frequency regions.

In an alternative embodiment of the invention, the wall structure which surrounds the radio-frequency regions is applied using photoresist lithography, the wall structure being formed from a metal coating which has been patterned by means of photolithography and has been etched. A wall structure including a metal layer is produced and additional shielding from electromagnetic interference fields is thus formed for the radio-frequency region. If the cover which has been adapted to the wall structure is also then additionally produced from a metal material, the radio-frequency region is completely surrounded by a metal structure and is thus optimally protected from stray fields. To this end, the metallic cover may additionally be connected to a ground potential in order to ensure that currents which have been induced are directly dissipated via the cover.

The multiplicity of semiconductor chips with a wall structure may be produced by separating the semiconductor wafer using a sawing technique. This is a proven method and may also be replaced with separation using laser ablation. The now individual semiconductor chips with a wall structure can be applied to a carrier in semiconductor device positions of a carrier using an automatic placement machine, the adhesive film from the sawing technique being able to be retained for die bonding.

A bonding wire technique is used in order to electrically connect the semiconductor chips to a wiring structure on the carrier via connecting elements. Since a large part of the bonding wire is routed in a plastic housing composition, it is ensured that there are no free bonding wires in the semiconductor device as is otherwise the case in cavity housings. In order to connect contact areas, which are sensitive to radio frequencies, inside a radio-frequency region to contact pads on a wiring structure of the carrier, the bonding wires may be routed via the wall structure and embedded in an adhesive layer using an adhesive layer between the cover and the wall structure in order, on the one hand, to thus fix the bonding wires and, on the other hand, to protect the bonding wires from displacement. This ensures that the contact area, which is sensitive to radio frequencies, on the active top side of the semiconductor chip is not covered by a plastic housing composition.

In order to apply the adapted cover to the wall structure, use may also be made, in addition to an adhesive layer as would be needed to embed a bonding wire, for example, of a double-sided adhesive film as long as no bonding wires need to be routed out of the radio-frequency region. Such a double-sided adhesive film may be fixed to the cover even before the latter is applied to the wall structure.

An injection-molding method or a dispensing method may be used in order to package the semiconductor chips, the connecting elements, the wall structure and at least parts of the cover and of the carrier in a plastic housing composition. Both methods have their advantages and disadvantages. While the injection-molding method operates at high pressure and therefore requires that the cover is sealed in a highly precise manner on the wall structure, only a plastic housing composition which is then distributed on the carrier, by means of capillary forces and gravity, in such a manner that the semiconductor chips, the connecting elements and the wall structure and parts of the cover as well as parts of the carrier are covered by a plastic housing composition is applied in the dispensing method. The semiconductor device positions of the carrier can then finally be separated into individual semiconductor devices using a sawing technique or a laser separating technique.

In summary, in the present invention, some of the semiconductor chips containing regions which are particularly sensitive to radio frequencies are provided with a cavity, with the result that the direct surroundings above the affected lines and structures in principle comprise air having a relative permittivity $\epsilon_r$ of approximately 1.0. The cavity is produced in such a manner that a wall including photopatternable material such as a metal or a plastic material is first of all formed around the relevant chip area and, in a further process, the cavity is completed by applying a cover. The cavity produced in this manner may be entirely encapsulated with plastic by injection-molding so that a robust plastic housing including a plastic housing composition is produced.

This invention improves the radio-frequency capability of semiconductor housings by realizing a volume having a relative permittivity $\epsilon_r$ of 1.0 above semiconductor chip regions which are particularly sensitive to radio frequencies. In an alternative embodiment of the invention, the cavity is achieved at the wafer level by depositing a sacrificial material where a cavity is subsequently to be produced and then decomposing this sacrificial material at appropriate process temperatures in such a manner that the decomposition products can diffuse out through the remaining plastic.

FIG. 1 illustrates a diagrammatic cross section of a semiconductor device 1 according to a first embodiment of the invention. This semiconductor device 1 is intended for use in frequency bands above 10 GHz. The semiconductor chip 4 has a radio-frequency region 6 on its active top side 5. This radio-frequency region 6 is surrounded by a wall structure 9 which is either produced from a photoresist or is preferably produced from a metal layer which can be patterned by a photoresist with subsequent etching. This wall structure 9 completely surrounds the radio-frequency region 6 of the semiconductor chip 4 and is covered by a cover 10 which may likewise be made of metal or is formed from ceramic material, a glass material or a plastic material. This cover 10 is adapted to the size and areal extent of the radio-frequency region 6 and, in this embodiment of the invention, projects beyond the wall structure 9, its top side 11 being completely embedded in the surrounding plastic housing composition 8.

If the cover 10 and the wall structure 9 are made of metal, they simultaneously form a shield against electromagnetic stray fields. The metallic wall structure may be electrically connected, via an appropriate contact, to a bonding wire for a ground connection. In this embodiment of the invention, contact areas 13 which are connected, via bonding wires 15, to contact pads 16 on the carrier 20 in the form of a wiring substrate 17 are arranged on the active top side 5 of the semiconductor chip 4 outside the region of the wall structure 9. The contact pads 16 are connected, via a wiring structure 19 on the top side 21 of the wiring substrate 17, to through-contacts 22 which, for their part, are connected to external contact areas 23 on the underside 24 of the wiring structure 17. These external contact areas 23 may even be used for surface mounting on a superordinate printed circuit board or may be fitted with external contacts in order to then be available for surface mounting as external contacts of the semiconductor device 1 on the underside 24 of the wiring substrate 17.

Both the radio-frequency region 6, which is protected from the penetration of a plastic housing composition 8 by the wall structure 9 and the cover 10, and the low-frequency region 7 or the region for DC voltage supply connections are embedded in the plastic housing composition 8, the low-frequency region 7 directly touching the plastic housing composition 8, while the radio-frequency region 6 is arranged such that it is spaced apart from the plastic housing composition 8. In addition, in this first embodiment of the invention, the connecting elements 18 are completely embedded in the plastic housing composition 8 and the top side 21 of the wiring substrate 17 is partially embedded in the plastic housing composition 8.

Figure 2:
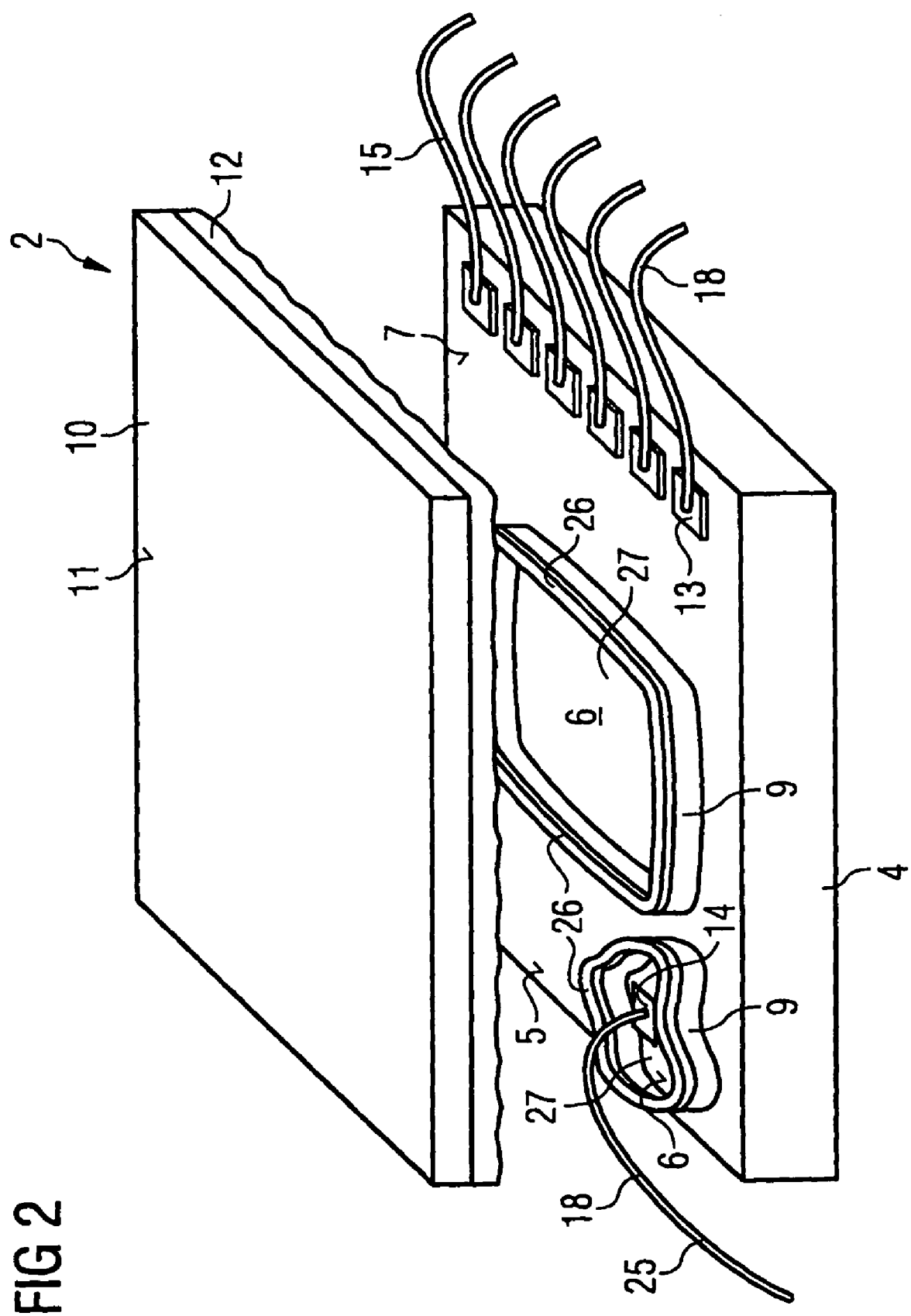
FIG. 2 illustrates an exploded perspective view of a semiconductor device according to a second embodiment of the invention.

FIG. 2 illustrates an exploded perspective view of a semiconductor device 2 according to a second embodiment of the invention. In this embodiment of the invention, two different types of connecting elements 18 are provided. Bonding wires 15 which are arranged in an edge zone in the low-frequency region 7 of the semiconductor chip 4 and are arranged there on contact areas 13 outside the wall structure 9 are provided on one side. An individual bonding wire 25 is arranged in the opposite edge region and is surrounded by a metallic wall structure 9 which has an insulation layer 26 on its top side. This insulation layer 26 is formed from a double-sided adhesive insulation film, the bonding wire 25 being arranged on a contact area 14 inside the radio-frequency region 6.

The insulation layer 26 protects the bonding wire 25 from a short circuit with the metallic wall structure 9. A further radio-frequency region 6 which is likewise surrounded by a metallic wall structure 9 is provided in the center of the active top side 5 of the semiconductor chip 4, the wall structure 9 having an insulation layer 26 on its top side. The cover 10 which, on the basis of the exploded illustration, is arranged above the semiconductor chip 4 is made of metal and has, on its underside, a thick adhesive layer 12 whose thickness corresponds at least to the diameter of the bonding wire 25 so that the latter can be embedded in the adhesive layer 12 on the underside of the cover 10. The top side 11 of the metallic cover 10 is freely accessible so that a heat sink or a connection to a ground potential can be connected on the metallic top side 11. This metallic design of the wall structure 9 and of the cover 10 ideally protects the radio-frequency regions 6 from electromagnetic interference fields in this embodiment of the invention.

Figure 3:
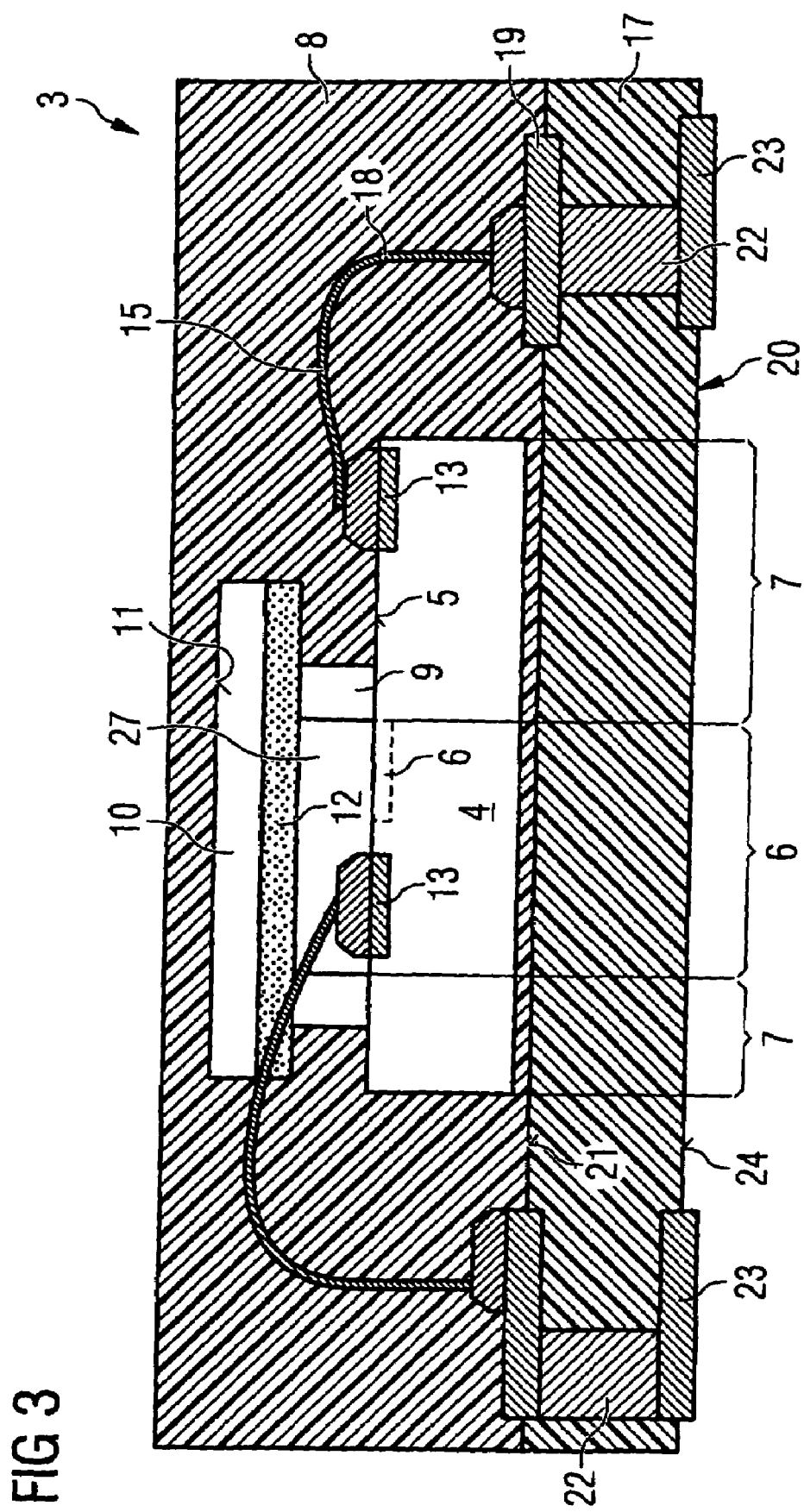
FIG. 3 illustrates a diagrammatic cross section through a semiconductor device of a third embodiment of the invention.

FIG. 3 illustrates a diagrammatic cross section through a semiconductor device 3 of a third embodiment of the invention. Components having the same functions as in the preceding figures are labeled using the same reference symbols and are not additionally discussed. The difference between this third embodiment of the invention and the first embodiment of the invention is that a contact pad 14 which is sensitive to radio frequencies and to which a bonding wire 15 is bonded is arranged inside the radio-frequency region 6, the bonding wire 15 being fixed by the adhesive layer 12 between the cover 10 and the wall structure 9 and being routed to a low-frequency contact pad 16 on the top side 21 of the carrier 20. In this case, the wall structure 9 is made of a photoresist layer so that additional insulation, as can be seen in the second exemplary embodiment of FIG. 2, is not required in order to route the connecting element 18 out of the radio-frequency region 6 to the low-frequency contact pad 16. This third embodiment also illustrates a contact area 13 on the active top side 5 of the semiconductor chip 4 in the low-frequency region 7 outside the wall structure 9, the contact area 13 being electrically connected, through the plastic housing composition 8, to a contact pad 16 of the wiring structure 19 on the top side 21 of the wiring substrate 17 via a bonding wire 15, as in the first embodiment of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device for radio frequencies of more than 10 GHz comprising:
    a semiconductor chip which, on its active top side, comprises a radio-frequency region and a low-frequency region and/or a region which is supplied with DC voltage, the low-frequency region and/or the region which is supplied with DC voltage of the semiconductor chip being embedded in a plastic housing composition and the plastic housing composition being arranged such that it is spaced apart from the radio-frequency region, by a cavity, on the active top side of the semiconductor chip, wherein the radio-frequency region comprises at least one contact area having a bonding wire which is partially arranged in the cavity and is partially arranged in the plastic housing composition, and wherein the bonding wire is fixed in an adhesive layer between a cover and a wall structure of the cavity, the adhesive layer having a thickness which is greater than or equal to the diameter of the bonding wire.

2. The semiconductor device as claimed in claim 1, wherein the wall structure comprises a photoresist which can be patterned by means of photolithography and can be cured.

3. The semiconductor device as claimed in claim 1, wherein the wall structure is terminated by a cover whose areal extent has been adapted.

4. The semiconductor device as claimed in claim 1, wherein the wall structure and at least parts of the cover are surrounded by the plastic housing composition.

5. The semiconductor device as claimed in claim 3, wherein the top side of the cover is free of plastic housing composition.

6. The semiconductor device as claimed in claim 3, wherein the cover comprises a silicon plate.

7. The semiconductor device as claimed in claim 3, wherein the cover comprises a metal plate.

8. The semiconductor device as claimed in claim 3, wherein the cover comprises a glass plate.

9. The semiconductor device as claimed in claim 3, wherein the cover comprises a ceramic plate.

10. The semiconductor device as claimed in claim 3, wherein the cover comprises a polymeric plastic plate.

11. The semiconductor device as claimed in claim 3, wherein a double-sided adhesive film is arranged between the cover and the wall structure.

12. The semiconductor device as claimed in claim 3, wherein an adhesive layer is arranged between the cover and wall structure.

13. The semiconductor device as claimed in claim 1, wherein the active top side of the semiconductor chip has contact areas outside a wall structure, the contact areas being electrically connected to contact pads on a wiring substrate via bonding wires and being embedded by the plastic housing composition.

14. The semiconductor device as claimed in claim 3, wherein the active top side of the semiconductor chip has contact areas outside and inside the wall structure, the contact areas being electrically connected to contact pads on a wiring substrate via bonding wires.

15. The semiconductor device as claimed in claim 1, wherein a wall structure has a height h of between several hundred nanometers and a few millimeters, where $0.1\ \mu m \leq h \leq 2000\ \mu m$.

16. The semiconductor device as claimed in claim 1, wherein the semiconductor device is configured for use in distance radar sensor technology for road and/or rail vehicles and for aircraft in the taxiing traffic and parked traffic on airfields.

17. A semiconductor device for radio frequencies of more than 8 GHz comprising:
    a semiconductor chip which, on its active top side, comprises a radio-frequency region and a low-frequency region and/or a region which is supplied with DC voltage; and
    means for providing a plastic housing composition, the low-frequency region and/or the region which is supplied with DC voltage of the semiconductor chip being embedded in the plastic housing composition means and the plastic housing composition means being arranged such that it is spaced apart from the radio-frequency region, by a cavity, on the active top side of the semiconductor chip, wherein the radio-frequency region comprises at least one contact area having a bonding wire which is partially arranged in the cavity and is partially arranged in the plastic housing composition, and wherein the bonding wire is fixed in an adhesive layer between a cover and a wall structure of the cavity, the adhesive layer having a thickness which is greater than or equal to the diameter of the bonding wire.

* * * * *

UNITED STATES PATENT AND TRADEMARK OFFICE
CERTIFICATE OF CORRECTION

PATENT NO. : 7,659,618 B2  Page 1 of 1
APPLICATION NO. : 11/488872
DATED : February 9, 2010
INVENTOR(S) : Dangelmaier et al.

It is certified that error appears in the above-identified patent and that said Letters Patent is hereby corrected as shown below:

Column 10, line 23, delete "$\mu m \leq h \leq 2000\ \mu m.$" and insert in place thereof --$\mu m \leq h \leq 2000\ \mu m.$--.

Column 10, line 32, delete "8 GHz" and insert in place thereof --10 GHz--.

Signed and Sealed this

Sixth Day of July, 2010

David J. Kappos
*Director of the United States Patent and Trademark Office*